United States Patent [19]
Bothra

[11] Patent Number: 5,933,020
[45] Date of Patent: Aug. 3, 1999

[54] PARASITIC RESISTANCE MEASURING DEVICE

[75] Inventor: Subhas Bothra, San Jose, Calif.

[73] Assignee: VLSI Technology, Inc., San Jose, Calif.

[21] Appl. No.: 08/731,528

[22] Filed: Oct. 16, 1996

[51] Int. Cl.⁶ ..................................................... G01R 31/22
[52] U.S. Cl. ........................................... 324/769; 324/765
[58] Field of Search ..................................... 324/769, 768, 324/765, 760, 716, 719; 438/14, 17; 257/40, 48

[56] References Cited

U.S. PATENT DOCUMENTS

| | | | |
|---|---|---|---|
| 3,889,188 | 6/1975 | Trindade | 324/769 |
| 4,542,340 | 9/1985 | Chakravati et al. | 324/769 |
| 4,942,357 | 7/1990 | Chang | 324/769 |

*Primary Examiner*—Vinh P. Nguyen
*Attorney, Agent, or Firm*—Wagner, Murabito & Hao

[57] ABSTRACT

A device and method for determining parasitic resistances in a metal oxide silicon field effect transistor (MOSFET). In one embodiment of the present invention, respective total resistances between a plurality of pairs of varyingly spaced apart first contacts of a first test structure are measured. The contact resistance between the plurality of first contacts and a first silicided region and a sheet resistance per unit length of the first silicided region are calculated from the previously measured respective total resistances. Next, respective total resistances between a plurality of pairs of varyingly spaced apart second contacts of a second test structure are measured. The present invention then calculates from the previously measured respective total resistances various resistance components contributing to a total resistance between any pair of the plurality of second contacts. The present invention then subtracts, from the total resistance between any two of the plurality of second contacts, the contact resistance between the plurality of first contacts and the first silicided region and the sheet resistance per unit length of the first silicided region. In so doing, the present invention determines the contact resistance between each of a plurality of second silicided regions and a respective adjacent lightly doped drain region. The present invention also determines a sheet resistance across any one of the respective lightly doped drain regions.

6 Claims, 9 Drawing Sheets

PARASITIC RESISTANCE MEASURING DEVICE

TECHNICAL FIELD

The present claimed invention relates to the field of semiconductor devices. More specifically, the present claimed invention relates to the measurement of parasitic resistance in semiconductor devices.

BACKGROUND ART

As semiconductor device sizes become smaller and smaller, device manufacturing and processing techniques must be carefully monitored in order to determine their effect on the operating parameters of the fabricated semiconductor device. As an example, the parasitic resistance of a semiconductor device can vary widely depending upon the particular manufacturing and processing techniques used to fabricate the device. More specifically, in a metal oxide silicon field effect transistor (MOSFET), the total parasitic resistance is comprised of various resistive components. The value of each of the resistive components may vary as fabrication parameters are changed.

With reference now to Prior Art FIG. 1, a side sectional view of a silicided MOSFET is shown. As shown in Prior Art FIG. 1, a conventional silicided MOSFET 100 is comprised of a semiconductor substrate 102 of p-type conductivity. N$^+$-type wells 104a and 104b are formed into the p-type substrate. It is understood by those of ordinary skill in the art that silicided MOSFET 100 could also be comprised of p$^+$-type wells residing in an n-type substrate. MOSFET 100 further includes lightly doped drain (Ldd) regions 106a and 106b peripherally bordering n$^+$-type wells 104a and 104b. Ldd regions 106a and 106b are formed during a doping fabrication step. More specifically, sidewall spacers 108a and 108b, attached to combination gate 110, shield Ldd regions 106a and 106b from heavy doping implantation during the device fabrication process. Thus, regions 106a and 106b are more lightly doped than regions 104a and 104b. A channel region 109 resides between regions 104a and 104b. Combination gate 110, disposed over channel region 109, is comprised of a layer of tungsten silicide 112 disposed over a layer of polysilicon 114. MOSFET 100 also includes silicide regions 116a and 116b which extend across regions 104a and 104b, respectively, and terminate at the edge of Ldd regions 106a and 106b, respectively. Silicided regions 116a and 116b are formed, for example, of titanium silicide, cobalt silicide, and the like. The above-described features are covered by a passivation layer 118 comprised, for example, of silicon dioxide or other dielectric material. Contacts 120a and 120b extend through passivation layer 118 and electrically contact silicided regions 116a and 116b, respectively.

When active, current flows from contact 120a through silicided region 116a, Ldd region 106a, channel region 109, Ldd region 106b, silicided region 116b, and into contact 120b. The above-described current path through MOSFET 100 has various parasitic resistances associated therewith. For example, a contact or interface resistance, $R_c$, occurs at the interface between each of contacts 120a and 120b and their respective underlying silicided regions 116a and 116b. Each of silicided regions 116a and 116b has a silicide sheet resistance per unit length, $\rho_{sil}$, associated therewith. Another contact resistance, $R_{sil/si}$, exists at the interface of each of silicided regions 116a and 116b and their respective bordering Ldd region 106a or 106b. Additionally, yet another resistance, $R_{Ldd}$, is associated with current flow through each of Ldd regions 106a and 106b.

Referring now to Prior Art FIG. 2A, a Prior Art test structure used to determine the interface resistance, $R_c$, occurring at the interface between a contact and an underlying silicon region is shown. As shown in Prior Art FIG. 2A, the test structure is comprised of a single test device 200. Single test device 200 is formed of a semiconductor substrate 202 of p-type conductivity. A single n$^+$-type well 204 is formed into the p-type substrate. It is understood by those of ordinary skill in the art that single test device 200 could also be comprised of a single p$^+$-type well residing in an n-type semiconductor substrate. A passivation layer 206 overlies well 204 and substrate 202. Single test device 200 further includes multiple contacts 208a–208e which extend through passivation layer 206 and electrically contact well 204.

Prior Art FIG. 2B is a top view of single test device 200. As shown in Prior Art FIG. 2B, each of contacts 208a–208e has a length, L, and a width, Z. Additionally, well 204 has a diffusion width, W. In single test device 200, contact 208a is separated from contact 208b by a distance $d_1$, contact 208b is separated from contact 208c by distance $d_2$ which is greater than distance $d_1$, contact 208c is separated from contact 208d by a distance $d_3$ which is greater than distance $d_2$, and contact 208d is separated from contact 208e by a distance $d_4$ which is greater than distance $d_3$.

Referring next to Prior Art FIG. 3, a graph 300 of the resistance measured between various pairs of contacts 208a–208e of Prior Art FIGS. 2A and 2B is shown. In conventional operation, the total resistance between various pairs of contacts 208a–208d is measured and plotted as a function of the distance separating the measured pair of contacts. In so doing, a line 302 is generated. The y-intercept of line 302, gives twice the value of the contact resistance, $R_c$, between any of contacts 208a–208e and underlying silicon region 204. Additionally, the sheet resistance per unit length, $\rho_{si}$, is given by the slope of line 302.

By plotting the resistances measured using single test device 200, only limited parasitic resistance values are obtained. That is, such a prior art device and method does not determine parasitic resistance components such as the contact resistance, $R_c$, occurring at the interface between contacts and their respective underlying silicided regions. Such a prior art device and method does not provide the silicide sheet resistance per unit length, $\rho_{sil}$. Additionally, single test device 200 and the above-described prior art resistance measuring method does not determine the contact resistance, $R_{sil/si}$, caused by the interface of a silicided region and a respective bordering Ldd region. Similarly, prior art single test devices and methods do not determine the resistance, $R_{Ldd}$, associated with current flow through an Ldd region.

Thus, the need has arisen for a test structure and method which efficiently determines the total parasitic resistance in a metal oxide silicon field effect transistor (MOSFET). A further need exists for a test structure and method which determines the resistance value of various resistive components comprising the total parasitic resistance.

DISCLOSURE OF THE INVENTION

The present invention provides a test structure and method which efficiently determines the total parasitic resistance in a metal oxide silicon field effect transistor (MOSFET). The present invention further provides a test structure and method which determines the resistance value of various resistive components comprising the total parasitic resistance. The present invention achieves the above accomplishments with a test structure and method in which resistive components of two test devices are subtracted from each other to provide the various resistance values comprising the total parasitic resistance of a MOSFET.

Specifically, in one embodiment of the present invention, respective total resistances between a plurality of pairs of varyingly spaced apart first contacts of a first test device are measured. The contact resistance between the plurality of first contacts and a first silicided region and a sheet resistance per unit length of the first silicided region are calculated from the previously measured respective total resistances. Next, respective total resistances between a plurality of pairs of varyingly spaced apart second contacts of a second test device are measured. The present invention then calculates from the previously measured respective total resistances various resistance components contributing to a total resistance between any pair of the plurality of second contacts. The present invention then subtracts, from the total resistance between any two of the plurality of second contacts, the contact resistance between the plurality of first contacts and the first silicided region and the sheet resistance per unit length of the first silicided region. In so doing, the present invention determines the contact resistance between each of a plurality of second silicided regions and a respective adjacent lightly doped drain region. The present invention also determines a sheet resistance across any one of the respective lightly doped drain regions.

These and other advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

PRIOR ART

PRIOR ART

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
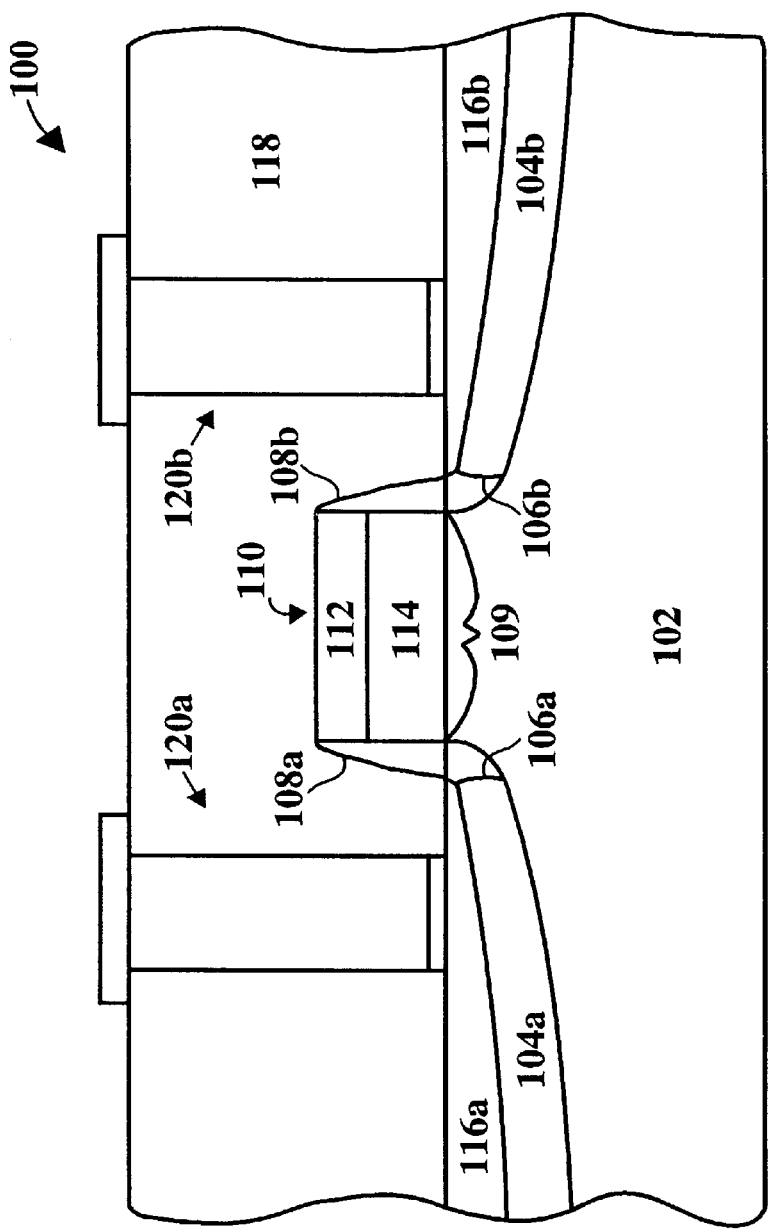
FIG. 1 is a side sectional view of a conventional metal oxide silicon field effect transistor (MOSFET).
Figure 2A:
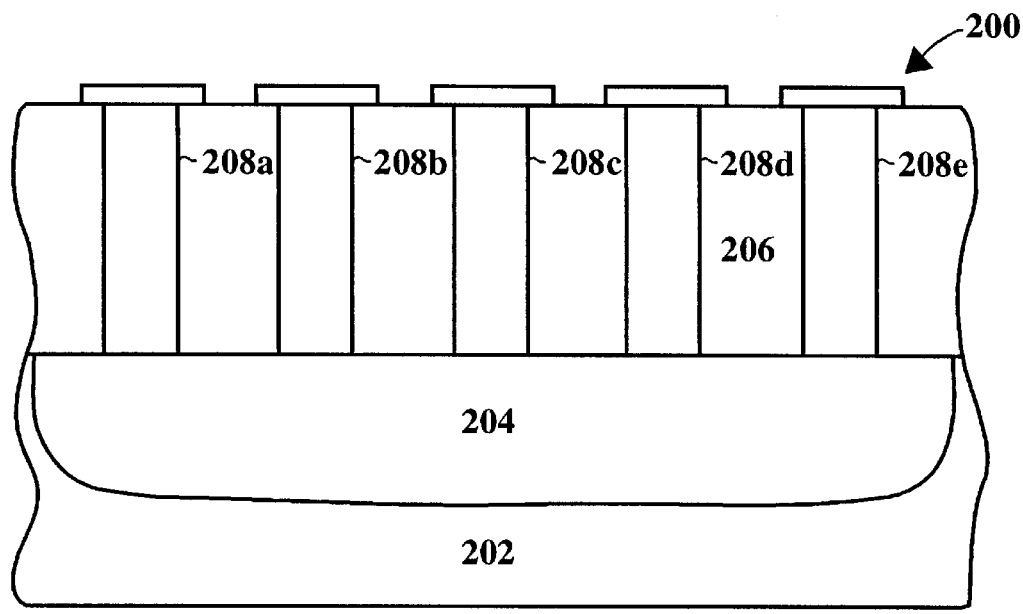
FIG. 2A is a side sectional view of a Prior Art test structure used to determine the interface resistance, $R_c$, occurring at the interface between a contact and an underlying silicon region.
Figure 2B:
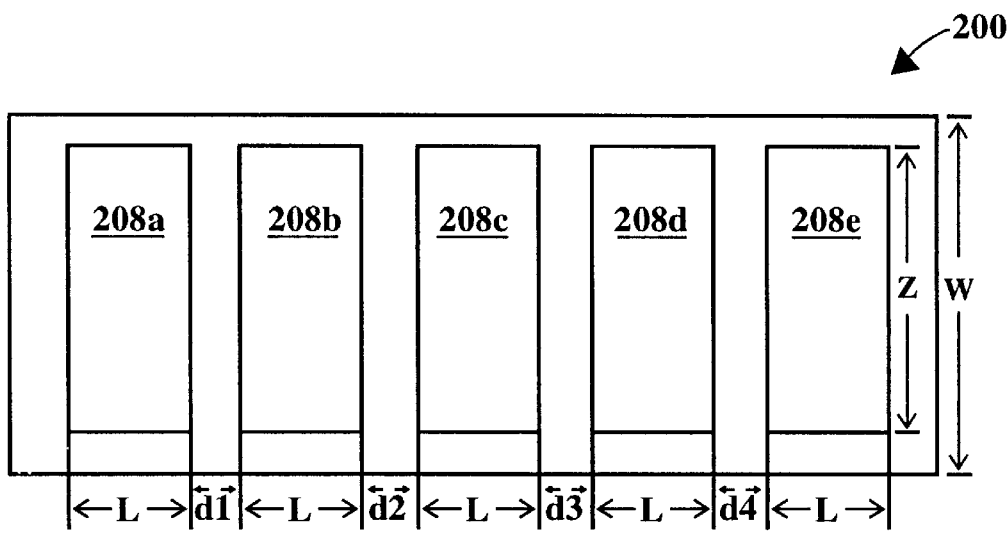
FIG. 2B is a top view of the Prior Art test structure of PRIOR ART FIG. 2A.
Figure 3:
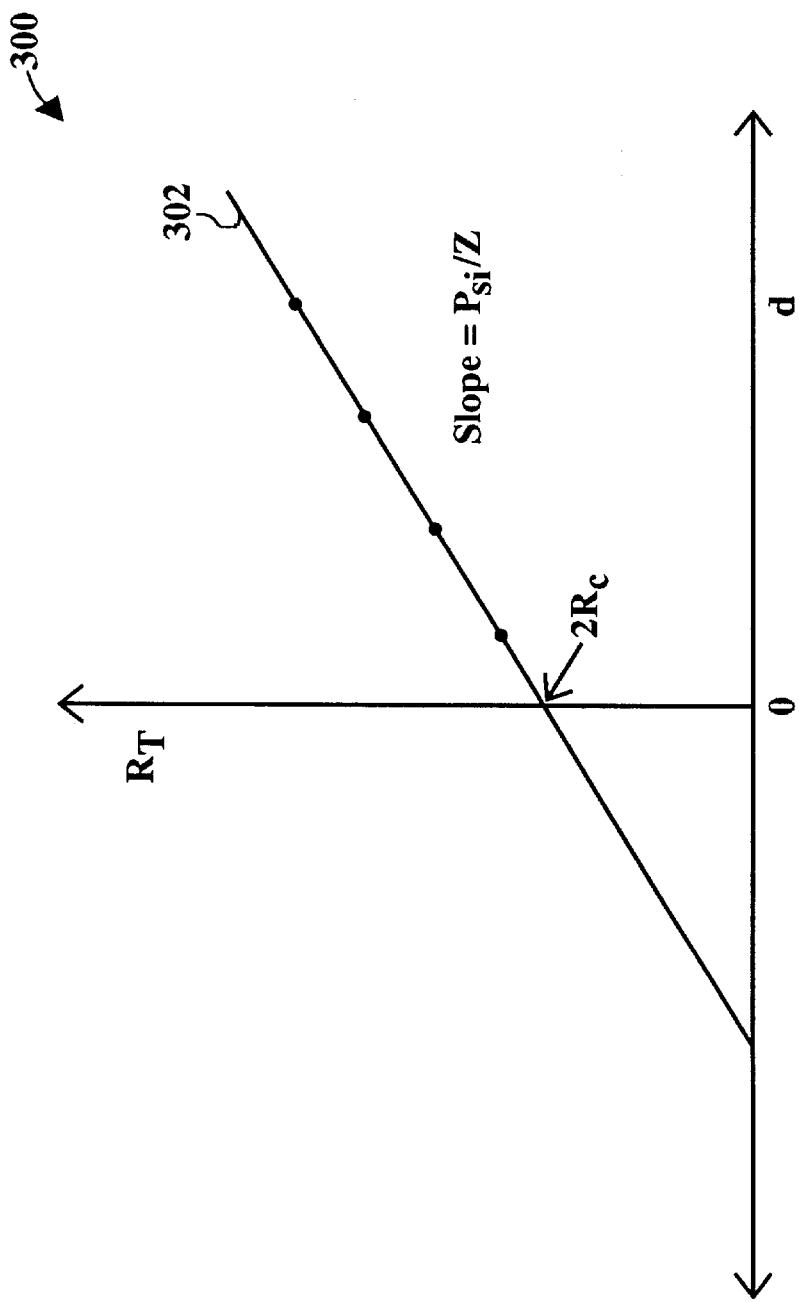
FIG. 3 is a graph of resistances measured between various respective pairs of contacts of PRIOR ART FIGS. 2A and 2B.
Figure 4A:
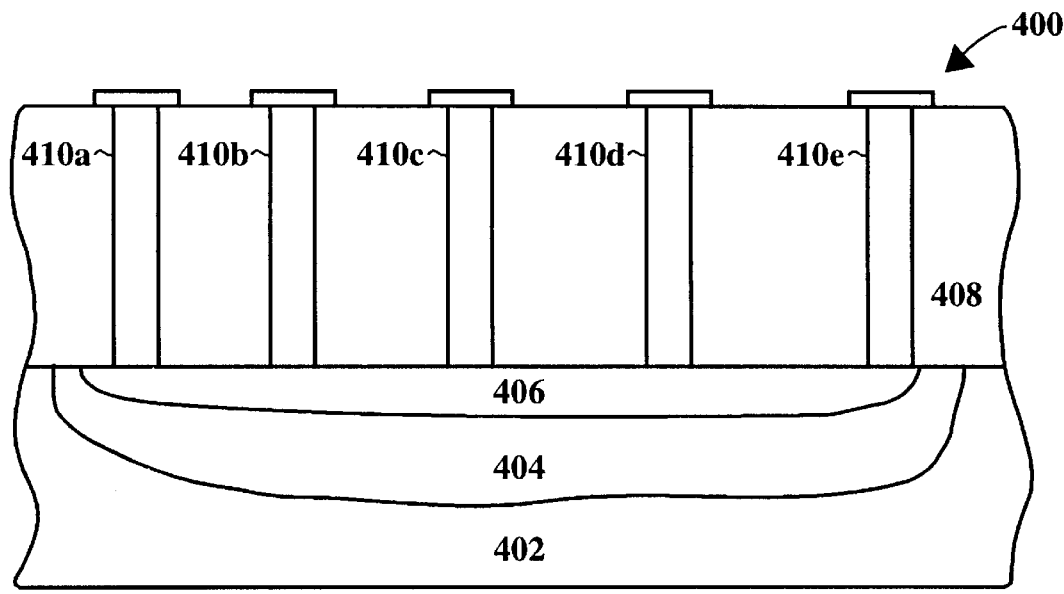
FIG. 4A is a side sectional view of a first test device of the present parasitic resistance measuring structure in accordance with the present claimed invention.

With reference now to FIG. 4A, a side sectional view of the first test device 400 of the present parasitic resistance measuring test structure is shown. The following discussion will begin with a detailed description of the physical characteristics of the present parasitic resistance measuring test structure. The discussion will then contain a detailed description of the operation of the present parasitic resistance measuring test structure. Regarding the physical structure of the present parasitic resistance measuring test structure, first test device 400 of the present invention is used to determine the interface resistance, $R_c$, occurring at the interface between a contact and an underlying silicided region. As shown in FIG. 4A, first test device 400 is formed of a semiconductor substrate 402 of p-type conductivity. A single $n_+$-type well 404 is formed into the p-type substrate. Although well 404 is of n-type conductivity, first test device 400 could also be comprised of a single p-type conductivity well residing in an n-type semiconductor substrate. First device 400 also includes a silicided region 406 residing within $n_+$-well 404. In the present embodiment, silicided region 406 is formed of titanium silicide. Although such a silicide is used in the present embodiment, the present invention is also well suited to forming silicided region 406 of various other metal suicides such as, for example, cobalt silicide and the like.

With reference still to FIG. 4A, first test device 400 further includes a passivation layer 408 which overlies silicided region 406, $n_+$-well 404, and substrate 402. In the present embodiment, passivation layer 408 is formed of silicon dioxide. Although such a material is used in the present embodiment, the present invention is also well suited to forming passivation layer 408 of various other materials such as, for example, borophosphosilicateglass (BPSG) or other dielectric materials. First test device 400 of the present parasitic resistance measuring test structure further includes multiple contacts 410a–410e which extend through passivation layer 408 and electrically contact silicided region 406.

Figure 4B:
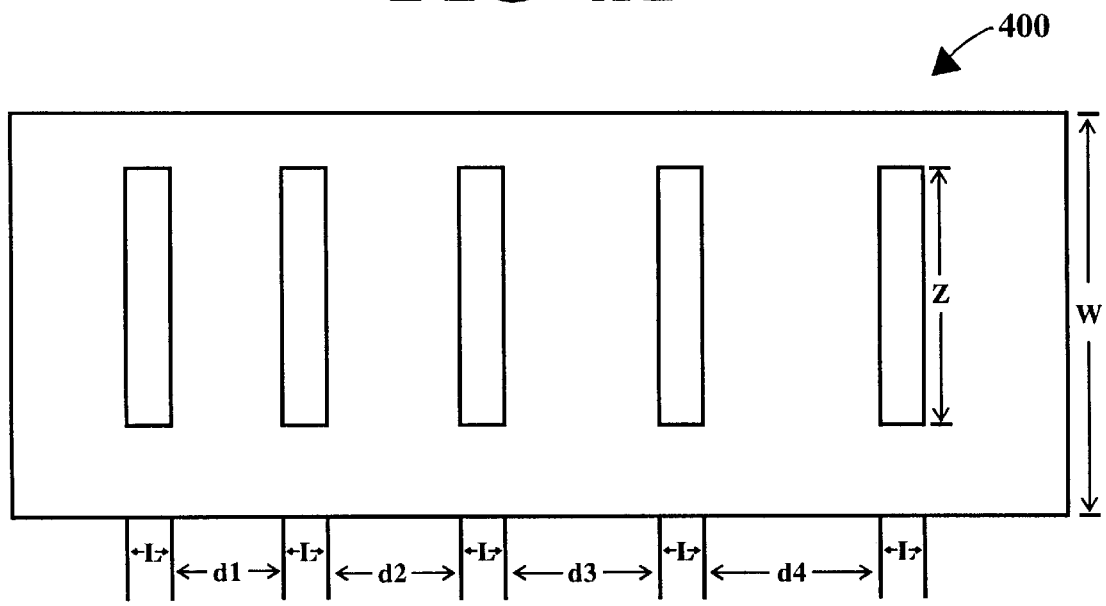
FIG. 4B is a top view of the first test device of FIG. 4A in accordance with the present claimed invention.

FIG. 4B is a top view of first test device 400. As shown in FIG. 4B, each of contacts 408a–408e has a length, L, and a width, Z. Additionally, $n_+$-well 404 has a diffusion width, W. In first test device 400 of the present test structure, contact 410a is separated from contact 410b by a distance $d_1$, contact 410b is separated from contact 410c by distance $d_2$ which is greater than distance $d_1$, contact 410c is separated from contact 410d by a distance $d_3$ which is greater than distance $d_2$, and contact 410d is separated from contact 410e by a distance $d_4$ which is greater than distance $d_3$. Although such contact separation distances and such a separation distance pattern is used in the present embodiment, the present invention is also well suited to having contacts 410a–410e separated by various other distances, and to having various other separation distance patterns.

Figure 5A:
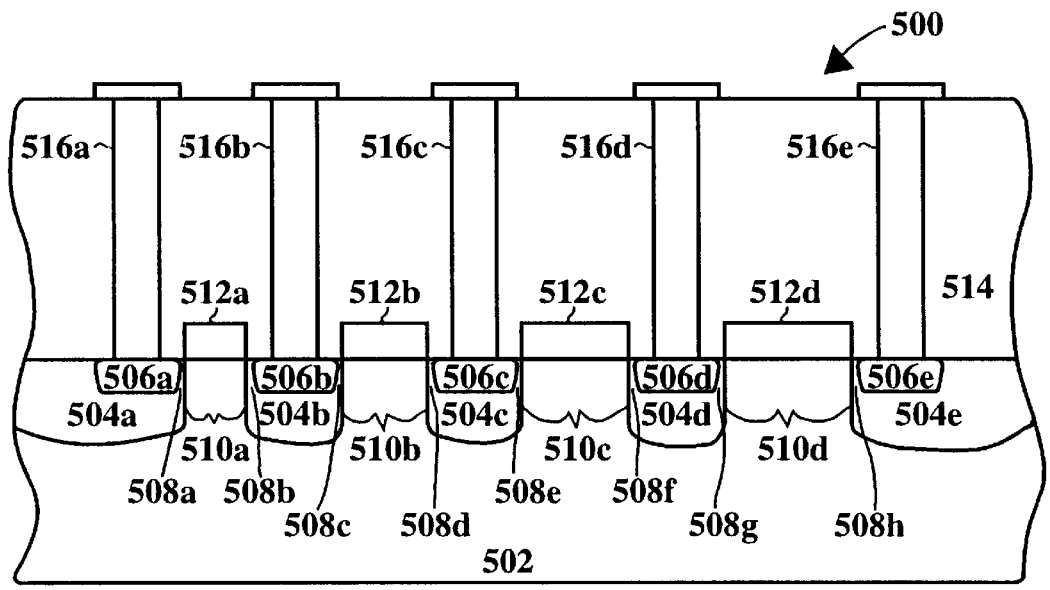
FIG. 5A is a side sectional view of a second test device of the present parasitic resistance measuring structure in accordance with the present claimed invention.

With reference next to FIG. 5A, a side sectional view of the second test device of the present parasitic resistance measuring test structure is shown. Second test device 500 is a comprised of a semiconductor substrate 502 of p-type conductivity. A plurality of n$^+$-type wells 504 are formed into p-type substrate 502. Although wells 504a–504e are of n-type conductivity, second test device 500 could also be comprised of a plurality of p-type conductivity wells residing in an n-type semiconductor substrate. Second test device 500 also includes a plurality of silicided regions 506a–506e residing within n$^+$-wells 504a–504e. In the present embodiment, silicided regions 506a–506e are formed of titanium silicide. Although such a silicide is used in the present embodiment, the present invention is also well suited to forming silicided regions 506a–506e of various other metal silicides such as, for example, cobalt silicide and the like. Second test device 500 further includes lightly doped drain (Ldd) regions 508a–508g peripherally bordering n$^+$-type wells 504a–504e as shown.

Referring still to FIG. 5A, second test device 500 of the present parasitic resistance measuring test structure further includes a plurality of channel regions 510a–510d residing between respective pairs of wells 504a–504e. Channel regions 510a–510d are of varying length. That is, channel region 510b is slightly longer than channel region 510a, channel region 510c is slightly longer than channel region 510b, and channel region 510d is slightly longer than channel region 510c. Second test device 500 also includes a plurality of gates 512a–512d disposed over respective channel regions 510a–510d. Furthermore, gates 512a–512d are also of a varying length. That is, gate 512b is slightly longer than gate 512a, gate 512c is slightly longer than gate 512b, and gate 512d is slightly longer than gate 512c. In the present embodiment, gates 512a–512d are combination gates. More specifically, gates 512a–512d are comprised of a layer of tungsten silicide disposed over a layer of polysilicon. The above-described features are covered by a passivation layer 514 comprised, for example, of silicon dioxide or other dielectric material. Contacts 516a–516e extend through passivation layer 514 and electrically contact silicided regions 506a–506e, respectively.

Figure 5B:
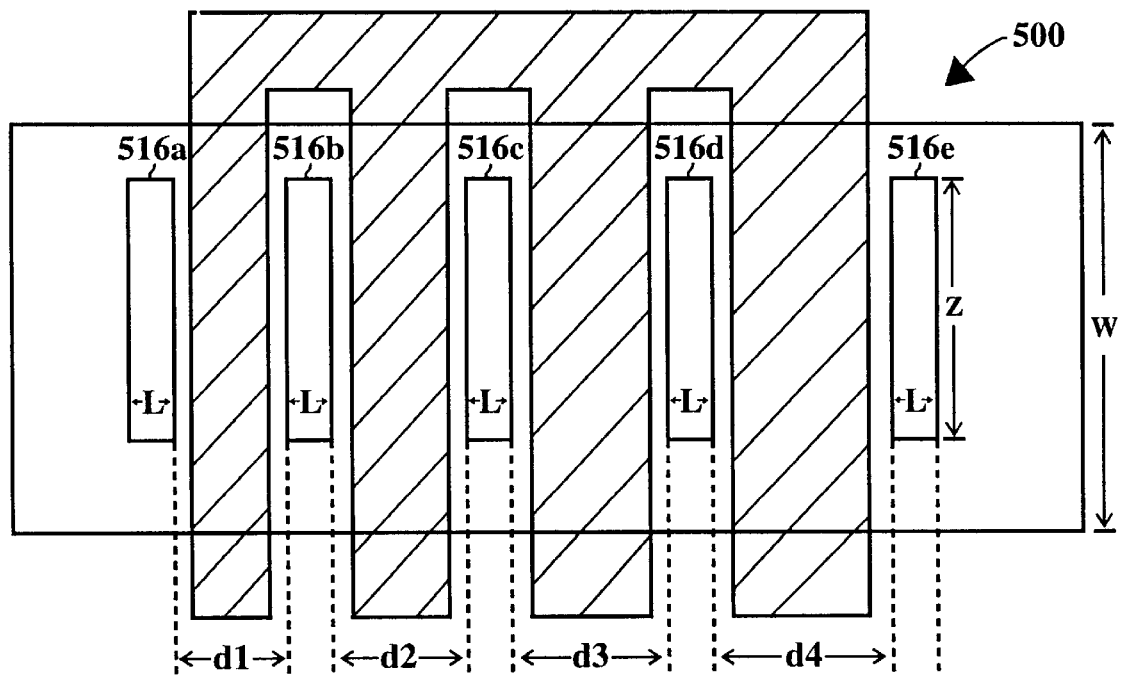
FIG. 5B is a top view of the second test device of FIG. 5A in accordance with the present claimed invention.

FIG. 5B is a top view of second test device 500. As shown in FIG. 5B, each of contacts 516a–516e has a length, L, and a width, Z. Additionally, n$^+$-wells 504a–504e have a diffusion width, W. In second test device 500 of the present test structure, contact 516a is separated from contact 516b by a distance $d_1$, contact 516b is separated from contact 516c by distance $d_2$ which is greater than distance $d_1$, contact 516c is separated from contact 516d by a distance $d_3$ which is greater than distance $d_2$, and contact 516d is separated from contact 516e by a distance $d_4$ which is greater than distance $d_3$. Although such contact separation distances and such a separation distance pattern is used in the present embodiment, the present invention is also well suited to having contacts 516a–516e separated by various other distances, and to having various other separation distance patterns. In the present embodiment, both the first test device and the second test device are formed on the same semiconductor wafer and are used to determine characteristics of other semiconductor devices formed on the semiconductor wafer.

In Operation

Figure 6A:
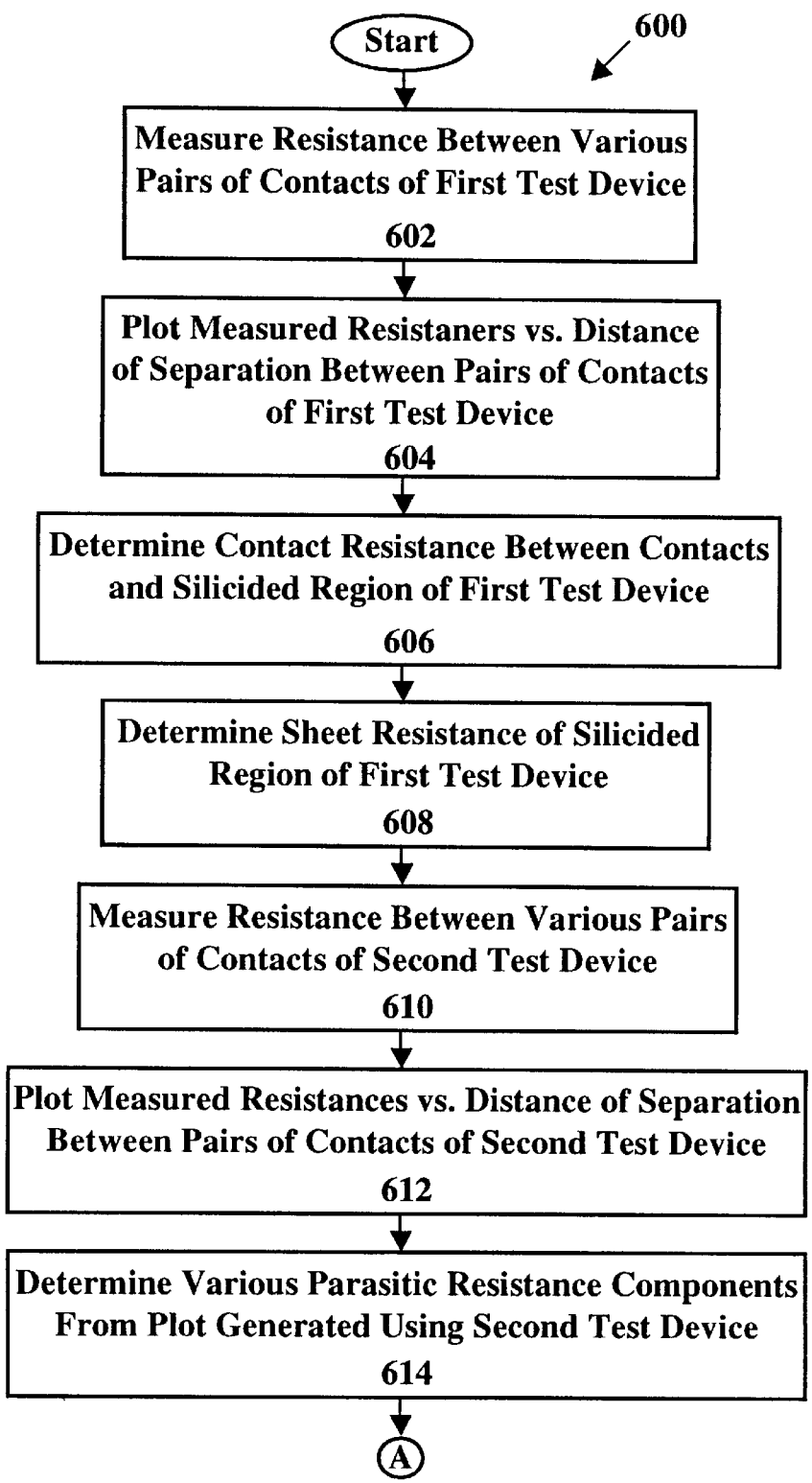
FIGS. 6A and 6B comprise a flow chart of steps performed during operation of the present parasitic resistance measuring structure in accordance with the present claimed invention.
Figure 6B:
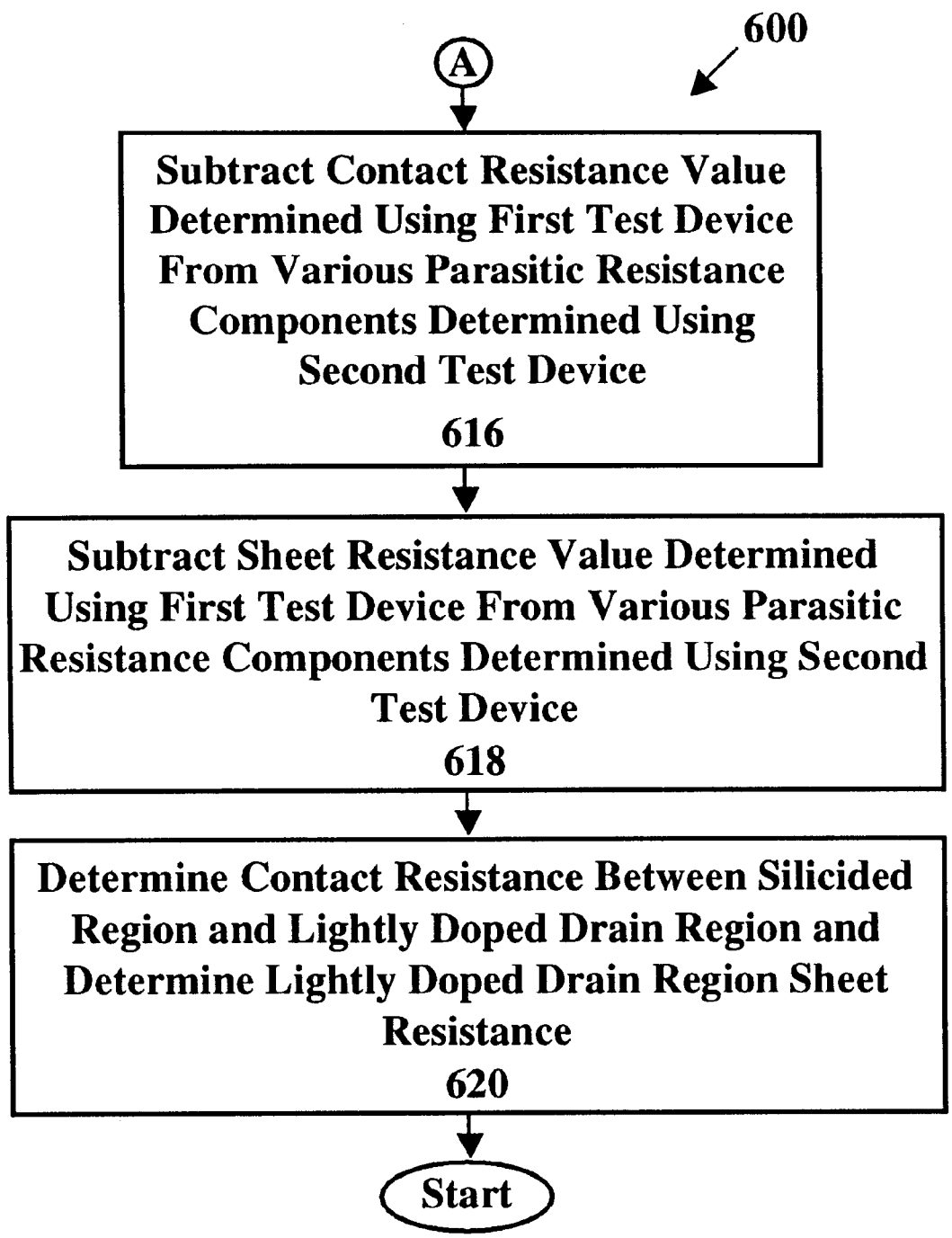

The following is a detailed description of the method of operation of the present invention. With reference next to FIGS. 6A and 6B, a flow chart 600 of steps employed by the present invention is shown. The following steps will be described in conjunction with FIGS. 4A, 4B, 5A, and 5B. As shown in step 602, the resistance between various pairs of contacts 410a–410e, of FIGS. 4A and 4B, is measured. For example, the resistance between contacts 410a and 410b, the resistance between contacts 410a and 410c, the resistance between contacts 410a and 410d, and the resistance between contacts 410a and 410e, is measured.

Figure 7:
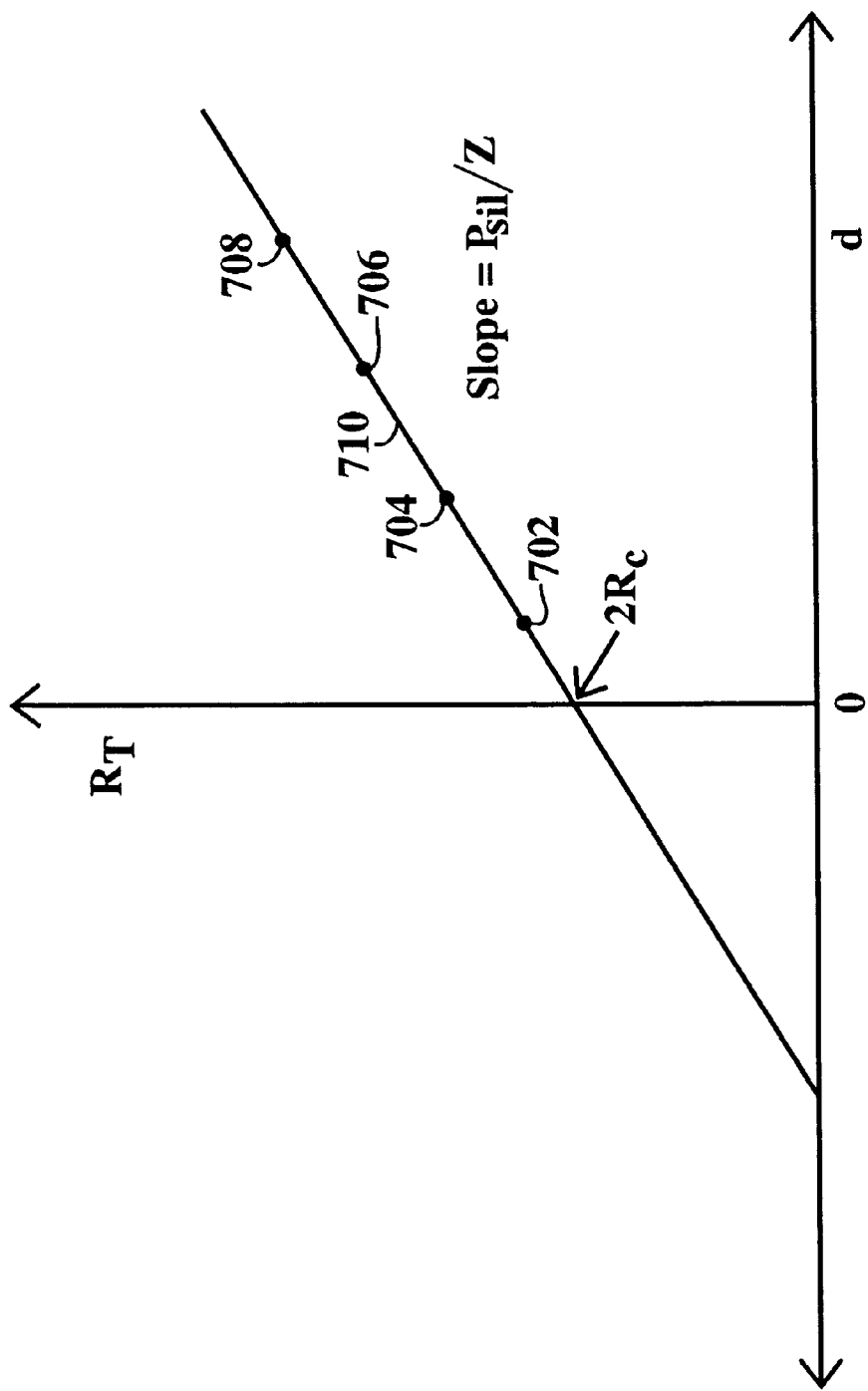
FIG. 7 is a graph of resistances measured between various respective pairs of contacts of the first test device of FIGS. 4A and 4B in accordance with the present claimed invention.

In step 604, the total measured resistance, $R_T$, between the various pairs of contacts is plotted versus the distance by which the various pairs of contacts are separated. A graph generated in step 604 is shown in FIG. 7. In the exemplary graph of FIG. 7, data point 702 represents the resistance measured between contacts 410a and 410b, data point 704 represents the resistance measured between contacts 410a and 410c, data point 706 represents the resistance measured between contacts 410a and 410d, data point 708 represents the resistance measured between contacts 410a and 410e. As indicated in the graph of FIG. 7, the resistance between pairs of contacts 410a–410e increases as the distance of separation between the pairs of contact increases. By connecting exemplary data points 702, 704, 706, and 708, a line 710 is generated.

Next, as shown is step 606, the contact resistance, $R_c$, between any one of contacts 410a–410e and silicided region 406 is determined from the graph of FIG. 7. More specifically, the y-intercept of line 710, gives twice the value of the contact resistance, $R_c$, between any one of contacts 410a–410e and silicided region 406.

Referring now to step 608 of FIG. 6A, the present parasitic resistance measuring invention determines the sheet resistance per unit length, $\rho_{sil}/Z$ of silicided region 406. More specifically, the slope of line 710, gives the value, $\rho_{sil}/Z$. Thus, first test device 400 of the present invention is used to determine the contact resistance, $R_c$, between any one of contacts 410a–410e and silicided region 406, and the sheet resistance per unit length, $\rho_{sil}/Z$ of silicided region 406.

With reference next to step 610, the resistance between various pairs of contacts 516a–516e, of FIGS. 5A and 5B, is measured. For example, the resistance between contacts 516a and 516b, the resistance between contacts 516a and 516c, the resistance between contacts 516a and 516d, and the resistance between contacts 516a and 516e, is measured.

Figure 8:
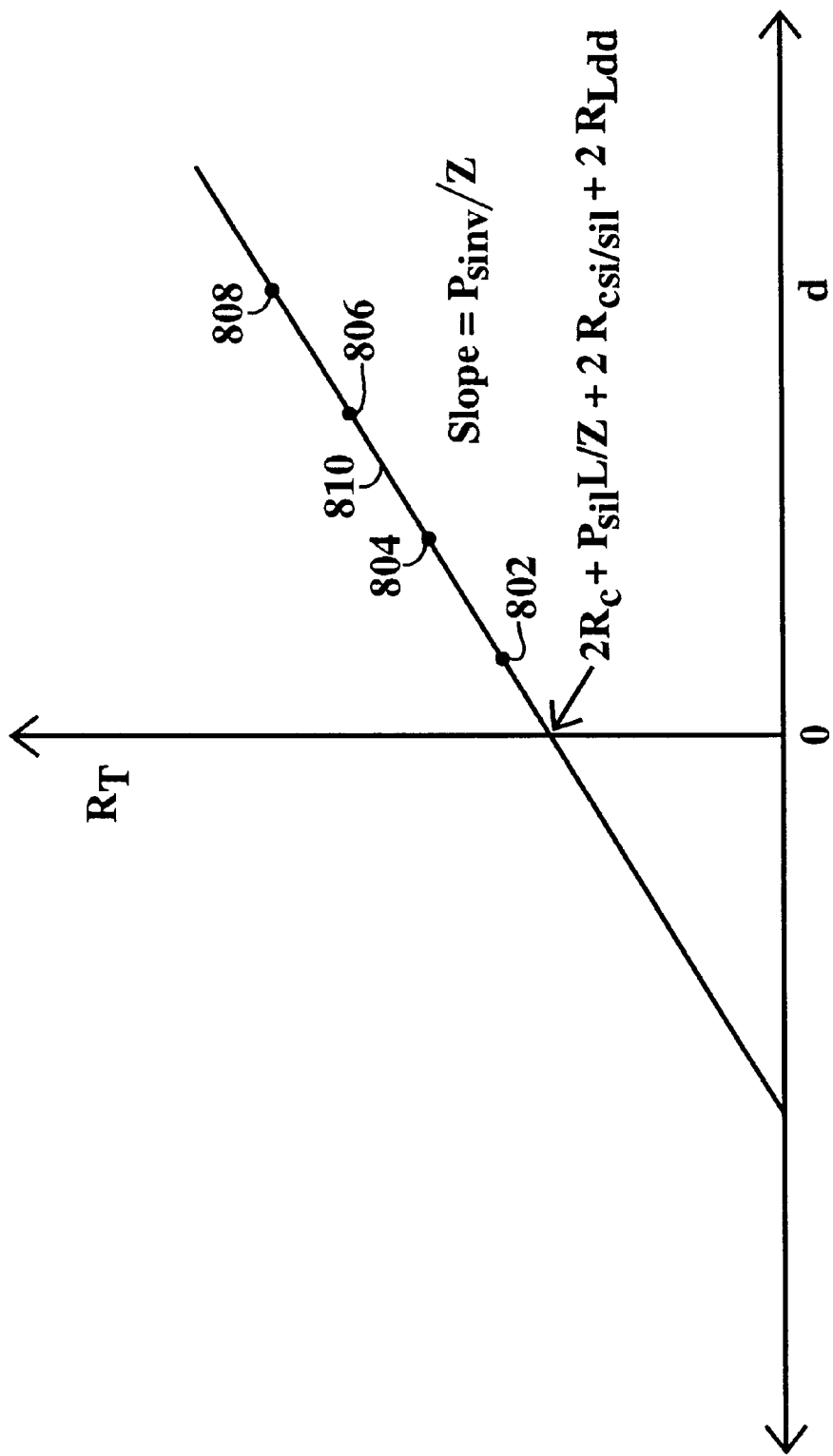
FIG. 8 is a graph of resistances measured between various respective pairs of contacts of the second test device of FIGS. 5A and 5B in accordance with the present claimed invention.

In step 612, the total measured resistance, $R_T$, between the various pairs of contacts of second test device 500 is plotted versus the distance by which the various pairs of contacts are separated. A graph generated in step 612 is shown in FIG. 8. In the exemplary graph of FIG. 8, data point 802 represents the resistance measured between contacts 516a and 516b, data point 804 represents the resistance measured between contacts 516a and 516c, data point 806 represents the resistance measured between contacts 516a and 516d, data point 808 represents the resistance measured between contacts 516a and 516e. As indicated in the graph of FIG. 8, the resistance between pairs of contacts 516a–516e increases as the distance of separation between the pairs of contact increases. By connecting exemplary data points 802, 804, 806, and 808, a line 810 is generated.

Next, as shown is step 614, the y-intercept of line 810 gives various components of the parasitic resistance associated with a MOSFET. More specifically, the y-intercept of line 810 gives the value $2R_c + \rho_{sil}L/Z + 2R_{c\ si/sil} + 2R_{Ldd}$. That is, the y-intercept of line 810 gives twice the value of the contact resistance, $R_c$, between any one of contacts 516a–516e and the respective silicided region 506a–506e residing beneath the contact. The y-intercept of line 810 also gives the sheet resistance per unit length, $\rho_{sil}L/Z$ of silicided regions 506a–506e. Additionally, the y-intercept gives the twice the value of the contact resistance, $R_c$, between any one of silicided regions 506a–506e and a respective peripherally bordering Ldd region 508a–508g. The y-intercept also provides twice the value of the sheet resistance, $2R_{Ldd}$, through the lightly doped drain region. The slope of line 810 provides the sheet resistance per unit length, $\rho_{s\ inv}/Z$, of the silicon region, channels 510a–510d, under each of gates 512a–512d respectively. Although such a value is useful, it is not typically considered a component of the parasitic resistance of a MOSFET. Thus, second test device 500 of the present invention determines the total parasitic resistance associated with a MOSFET.

Referring now to step 616 of FIG. 6B, the present invention then subtracts the contact resistance value determined using the first test device from the total parasitic resistance measured using the second test device. That is, the present invention subtracts $2R_c$ from $2R_c+\rho_{sil}L/Z+2R_{c\ si/sil}+2R_{Ldd}$. In so doing, the value $\rho_{sil}L/Z+2R_{c\ si/sil}+2R_{Ldd}$ remains.

Referring now to step 618 of FIG. 6B, the present invention then subtracts the silicided sheet resistance value determined using the first test device from the value remaining after step 616. That is, the present invention subtracts $\rho_{sil}L/Z$ from $\rho_{sil}L/Z+2R_{c\ si/sil}+2R_{Ldd}$. In so doing, the value $2R_{c\ si/sil}+2R_{Ldd}$ remains. Thus, the present invention provides the parasitic resistance value contributed by the contact resistance, $R_c$, between a silicided region and a respective peripherally bordering Ldd region, and the parasitic resistance value contributed by the sheet resistance, $2R_{Ldd}$, through the lightly doped drain region. It is known that $2R_{c\ si/sil}+2R_{Ldd}$ are the dominant parasitic resistance components. The present invention allows these dominant resistance values to be monitored and quantitatively measured. As a result, the effect on parasitic resistance caused by changes to process parameters used during the fabrication of a MOSFET can be closely examined. In so doing, the present invention allows process parameters to be optimized such that minimal parasitic resistance is achieved.

Thus, the present invention provides a test structure and method which efficiently determines the total parasitic resistance in a metal oxide silicon field effect transistor (MOSFET). The present invention further provides a test structure and method which determines the resistance value of various resistive components comprising the total parasitic resistance.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A test structure for determining the parasitic resistance of a semiconductor device comprising:
    a first test device comprising:
        a first silicided region;
        a first passivation layer overlying said first silicided region;
        a plurality of first contacts formed through said first passivation layer, said plurality of first contacts electrically contacting said first silicided region, said plurality of first contacts separated from each other by varying distances, said plurality of first contacts electrically coupled to each other by said first silicided region, said first test device for determining a contact resistance between said plurality of first contacts and said first silicided region and a sheet resistance per unit length of said first silicided region; and
    a second test device comprising:
        a plurality of second silicided regions;
        a plurality of channel regions of varying length, a respective one of said plurality of channel regions disposed between respective adjacent ones of said plurality of second silicided regions, each of said plurality of channel regions peripherally bordered by a lightly doped drain region;
        a plurality of gates of varying length, each of said plurality of gates overlying a respective one of said plurality of channel regions;
        a second passivation layer overlying said plurality of second silicided regions, said plurality of channel regions, and said plurality of gates; and
        a plurality of second contacts formed through said second passivation layer, each of said plurality of second contacts electrically contacting a respective one of said plurality of second silicided regions, said plurality of second contacts separated from each other by varying distances, said second test device for determining a total resistance between any two of said plurality of second contacts; said first test device and said second test device related such that dominant parasitic resistance components of said semiconductor device are determined by comparing measurements taken using said first test device with measurements taken using said second test device.

2. The test structure of claim 1 wherein said first silicided region is formed of titanium silicide.

3. The test structure of claim 1 wherein said first silicided region is formed of cobalt silicide.

4. The test structure of claim 1 wherein said first passivation layer is formed of silicon dioxide.

5. The test structure of claim 1 wherein said plurality of gates are combination stack gates.

6. The test structure of claim 5 wherein said combination stack gates are formed of polysilicon and tungsten silicide.

* * * * *